(12) United States Patent
Little et al.

(10) Patent No.: US 11,799,223 B2
(45) Date of Patent: Oct. 24, 2023

(54) ELECTRICAL CONNECTOR ASSEMBLY

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Terrance F. Little, Fullerton, CA (US); Neng Xiao, Irvine, CA (US); Haozhe Zi, Irvine, CA (US)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 239 days.

(21) Appl. No.: 17/459,850

(22) Filed: Aug. 27, 2021

(65) Prior Publication Data

US 2021/0408706 A1 Dec. 30, 2021

Related U.S. Application Data

(63) Continuation-in-part of application No. 16/989,785, filed on Aug. 10, 2020, now Pat. No. 11,239,586.

(60) Provisional application No. 62/885,204, filed on Aug. 10, 2019, provisional application No. 62/959,886, (Continued)

(51) Int. Cl.
| | | |
|---|---|---|
| *H01R 12/00* | (2006.01) |
| *H01R 12/71* | (2011.01) |
| *H01R 13/639* | (2006.01) |
| *H01R 24/22* | (2011.01) |
| *H01R 13/516* | (2006.01) |
| *H01R 13/629* | (2006.01) |
| *H05K 1/11* | (2006.01) |
| *H01R 13/627* | (2006.01) |

(52) U.S. Cl.
CPC ......... *H01R 12/716* (2013.01); *H01R 13/516* (2013.01); *H01R 13/629* (2013.01); *H01R 13/639* (2013.01); *H01R 24/22* (2013.01); *H01R 13/6275* (2013.01); *H05K 1/111* (2013.01)

(58) Field of Classification Search
CPC ................. H01R 12/716; H01R 13/516; H01R 13/6275; H01R 13/629; H01R 13/639; H01R 24/22
See application file for complete search history.

(56) References Cited

U.S. PATENT DOCUMENTS

| | | | | |
|---|---|---|---|---|
| 10,193,253 B2 * | 1/2019 | Li | ............................ | H01R 12/83 |
| 10,923,843 B1 * | 2/2021 | Henry | .................. | H01R 12/714 |
| 11,125,958 B2 * | 9/2021 | Champion | ............. | G02B 6/428 |

(Continued)

*Primary Examiner* — Phuong Chi Thi Nguyen
(74) *Attorney, Agent, or Firm* — Ming Chieh Chang

(57) ABSTRACT

An angled type connector assembly includes a receptacle connector mounted upon a printed circuit board and having an insulative housing with an oblique opening to receive a plug connector, and a bottom opening through which the mating pads on the printed circuit board is upwardly exposed. The plug connector includes two rows of contacts respectively mechanically and electrically connected to the corresponding two rows of wires. The plug connector forms an oblique mating end or interface relative to an extending direction of the plug, on which the contacting sections of the contacts are exposed to mate with the corresponding mating pads on the printed circuit board.

20 Claims, 26 Drawing Sheets

Related U.S. Application Data filed on Jan. 11, 2020, provisional application No. 63/073,084, filed on Sep. 1, 2020.

(56) References Cited

U.S. PATENT DOCUMENTS

| | | |
|---|---|---|
| 11,239,586 B2 * | 2/2022 | Zheng ................ H01R 12/714 |
| 2019/0245288 A1 | 8/2019 | Lloyd et al. |
| 2019/0288422 A1 * | 9/2019 | Champion ......... H01R 13/6587 |
| 2020/0083627 A1 | 3/2020 | Peloza et al. |
| 2020/0358227 A1 | 11/2020 | Henry et al. |
| 2020/0366017 A1 | 11/2020 | Blackburn et al. |

\* cited by examiner

ELECTRICAL CONNECTOR ASSEMBLY

CROSS REFERENCE TO RELATED APPLICATIONS

This application is a continuation-in-part of the application Ser. No. 16/98,9785 filed Aug. 10, 2020, and the instant application further claims the benefit of, and priority to, U.S. Provisional Patent Application No. 63/073,084, filed on Sep. 1, 2020, the contents of which are incorporated entirely herein by reference.

BACKGROUND OF THE INVENTION

1. Field of the Invention

The present invention relates generally to an electrical connector assembly having a plug connector and a receptacle connector with an oblique mating direction.

2. Description of Related Art

The traditional design used for connecting two subsystems respectively on two printed circuit boards, discloses a linking cable with at one end a LEC plug connector mated to a receptacle connector embedded in the ASIC, and at the other end two port IFP plug connectors mated to on one side the so-called Interposer with IFT receptacle connector, and the other side thereof further configured with two ports of QSFP-28. Anyway, a receptacle connector on one printed circuit boards and a mated plug connector to the receptacle connector at one end of the cable f are required in traditional design.

Hence, a simple mating structure of the receptacle connector and the plug connector are desired.

SUMMARY OF THE INVENTION

An electrical connector assembly comprises a plug connector and a receptacle connector. The plug connector comprises an insulative plug housing enclosing a contact module therein, the plug contact module defining an oblique mating interface relative to an extending direction of the plug connector, and including a plurality of plug contacts integrally formed within a plug insulator. A plurality of wires extend rearwardly from the plug housing and electrically connect to corresponding plug contacts, respectively. The receptacle connector comprises an insulative receptacle housing defining an oblique extending mating space to receive the plug connector which is inserted into the oblique extending mating space in an oblique direction and a plurality of receptacle contacts located around a bottom face of the receptacle housing and mated with the plug contacts, respectively.

A plug connector comprises a housing defining an oblique mating interface relative to an extending direction of the plug connector, and including a plurality of contacts; a plurality of contacts retained in the housing and comprising retaining sections retained in the housing, contacting sections exposed upon the oblique mating interface, and soldering sections; a plurality of wires extending rearwardly from the housing and electrically connected to soldering sections the corresponding contacts, respectively. The contacting sections of the contacts extend slantwise offset the extending direction of the plug connector from the retaining sections, and provide lowest points for contacting with a receptacle connector in which the plug connector is inserted.

A receptacle connector comprises a housing mounted on a printed circuit board, and defining an oblique extending receiving space opening upwards, and an elongated opening at a bottom wall of the insulative housing; and a plurality of conductive pads defined on the printed circuit board, and aligned with the elongated opening thereby exposing to the receiving space.

Other advantages and novel features of the invention will become more apparent from the following detailed description of the present embodiment when taken in conjunction with the accompanying drawings.

DETAILED DESCRIPTION OF THE PREFERRED EMBODIMENT

Figure 1:
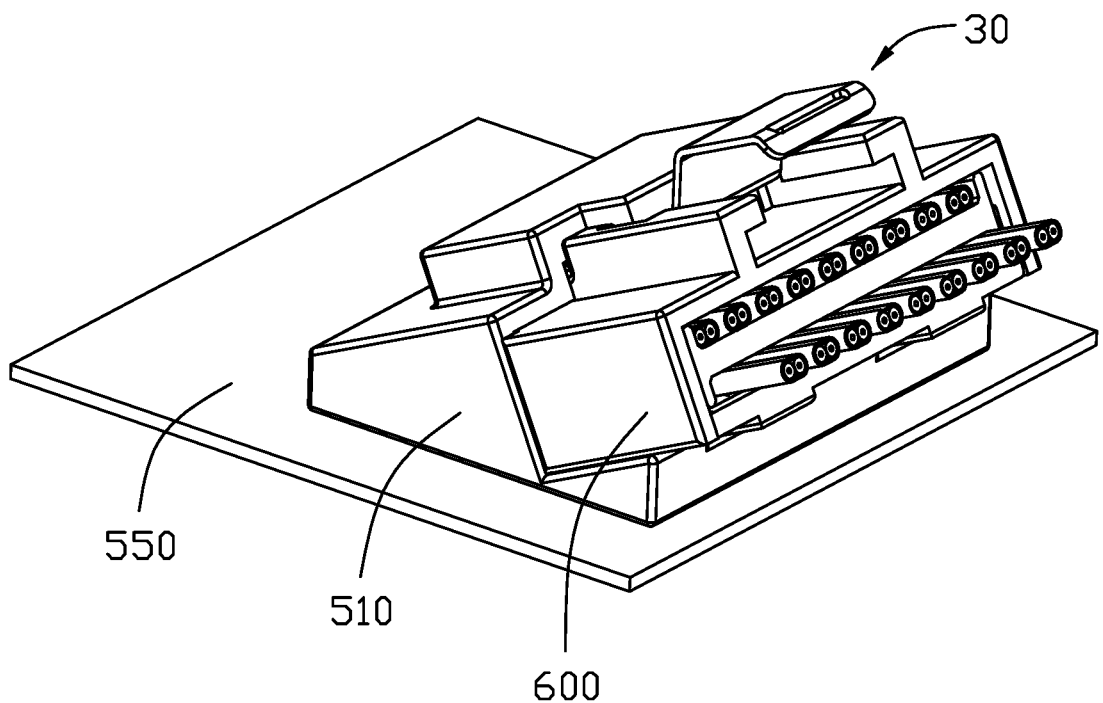
FIG. 1 is a perspective view of the electrical connector assembly including the mated plug connector and receptacle connector according to an embodiment of the invention.
Figure 2:
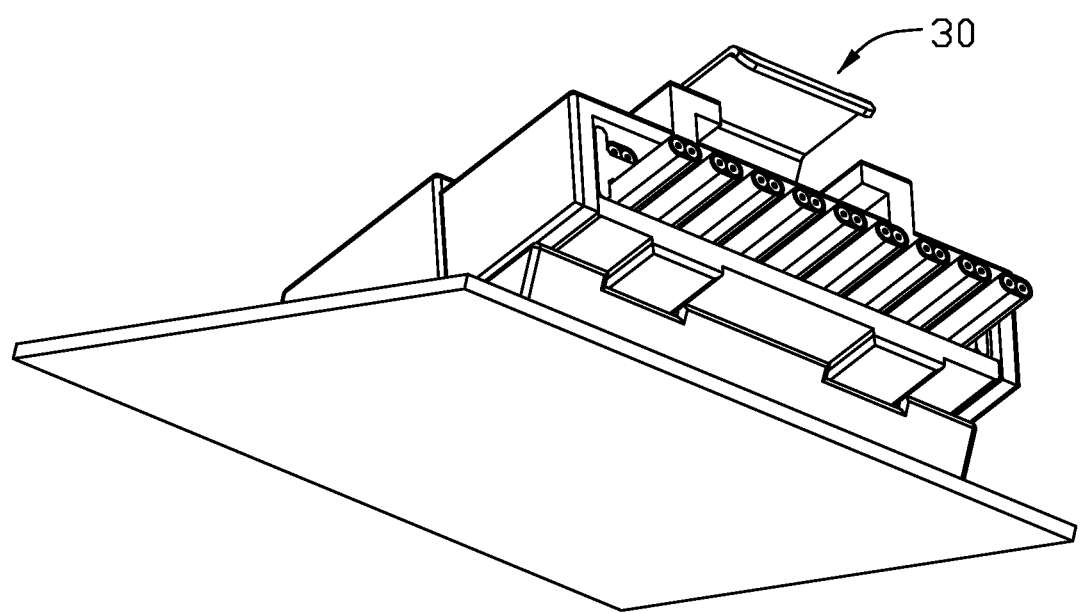
FIG. 2 is another perspective view of the electrical connector assembly of FIG. 1.
Figure 3:
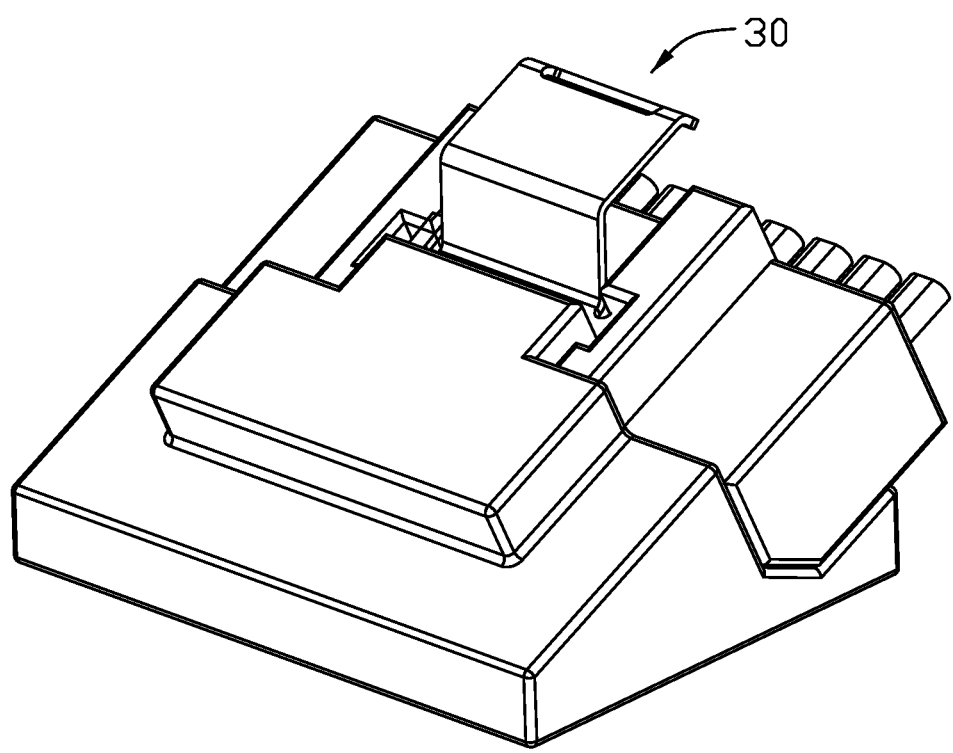
FIG. 3 is a perspective view of the electrical connector assembly of FIG. 1 without showing the printed circuit board thereof.
Figure 4:
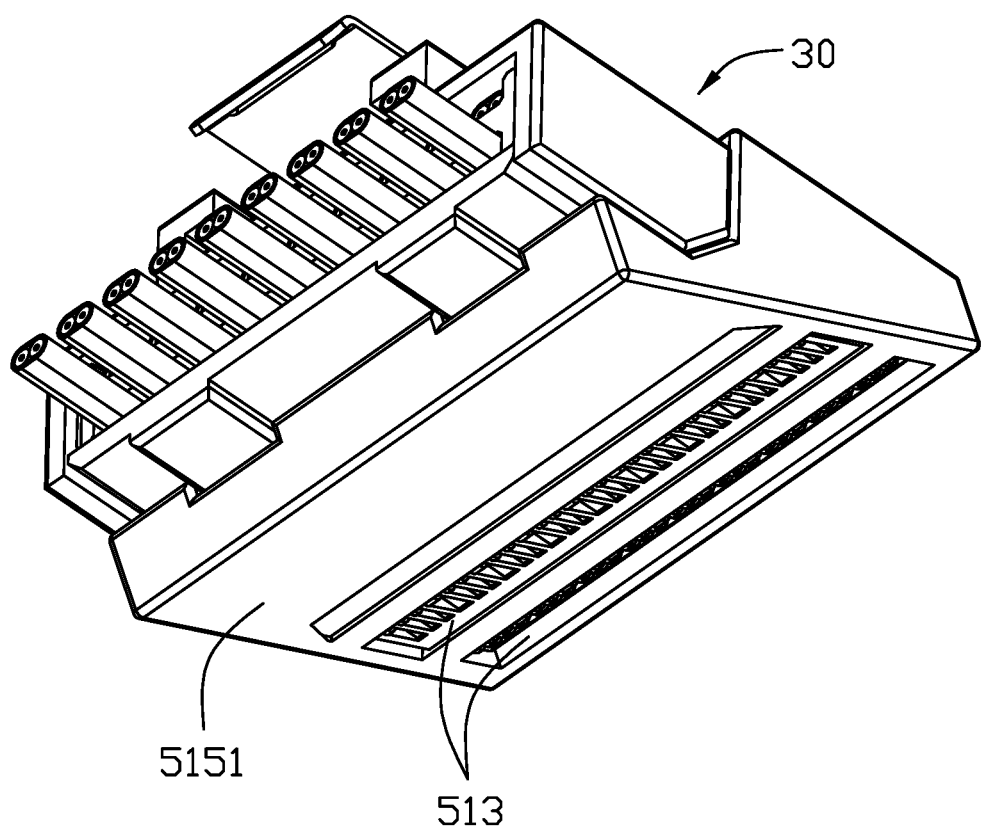
FIG. 4 is another perspective view of the electrical connector assembly of FIG. 3.
Figure 5:
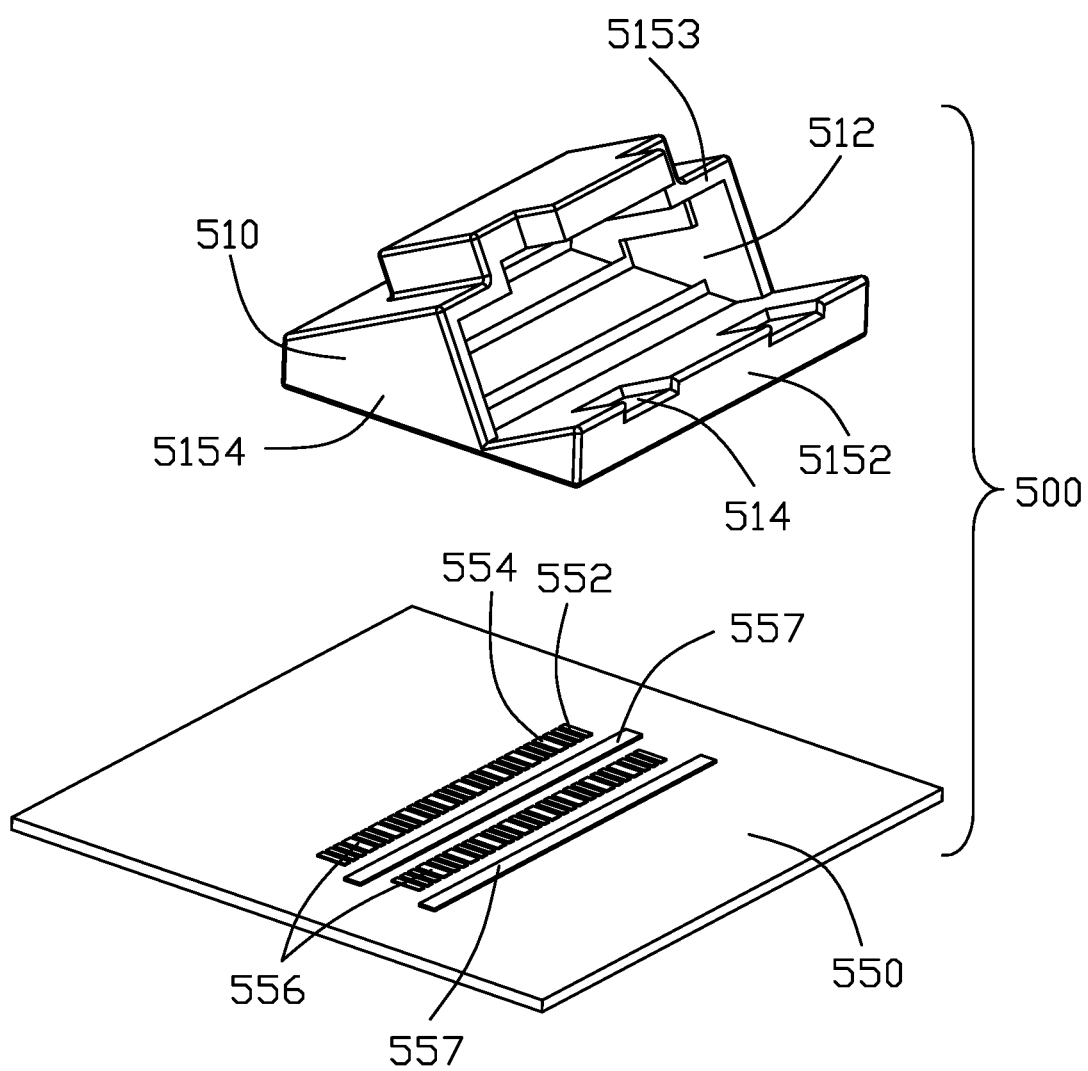
FIG. 5 is an exploded perspective view of the receptacle connector assembly of FIG. 1 wherein the receptacle connector is separated from the printed circuit board.
Figure 6:
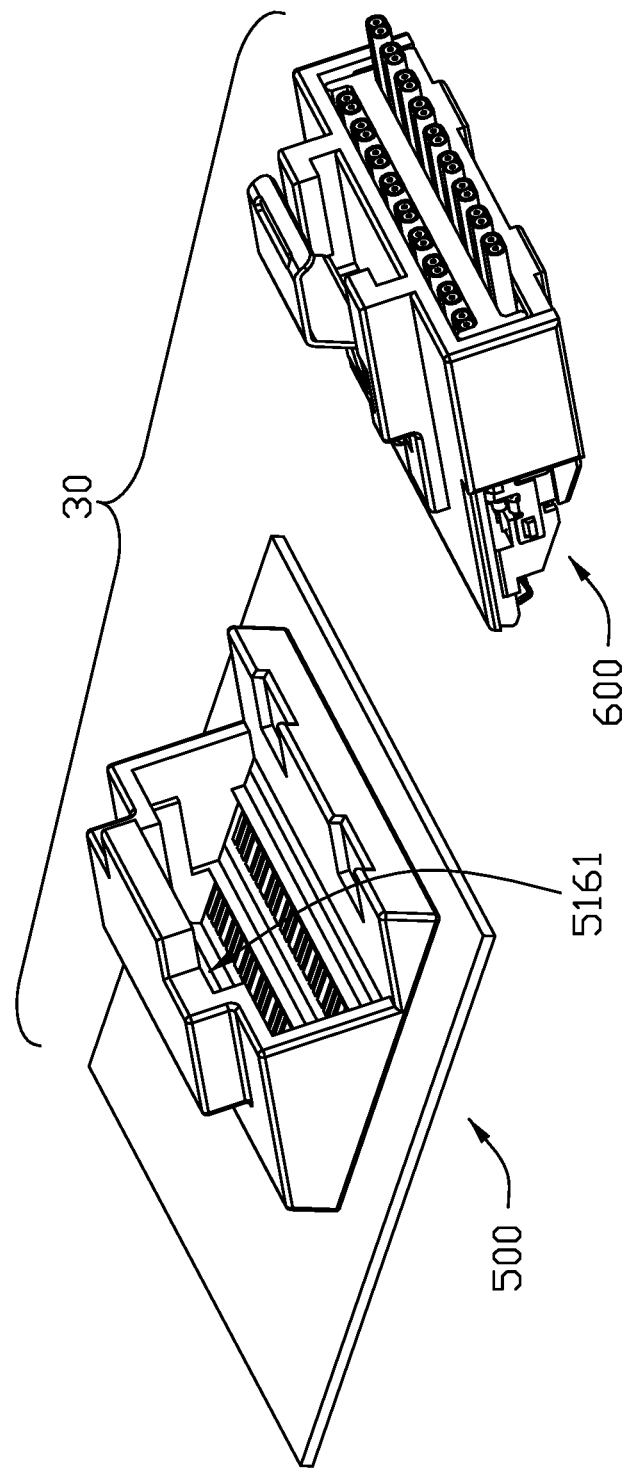
FIG. 6 is a perspective view of the electrical connector assembly of FIG. 1 wherein the plug connector and the receptacle connector are separated from each other.
Figure 7:
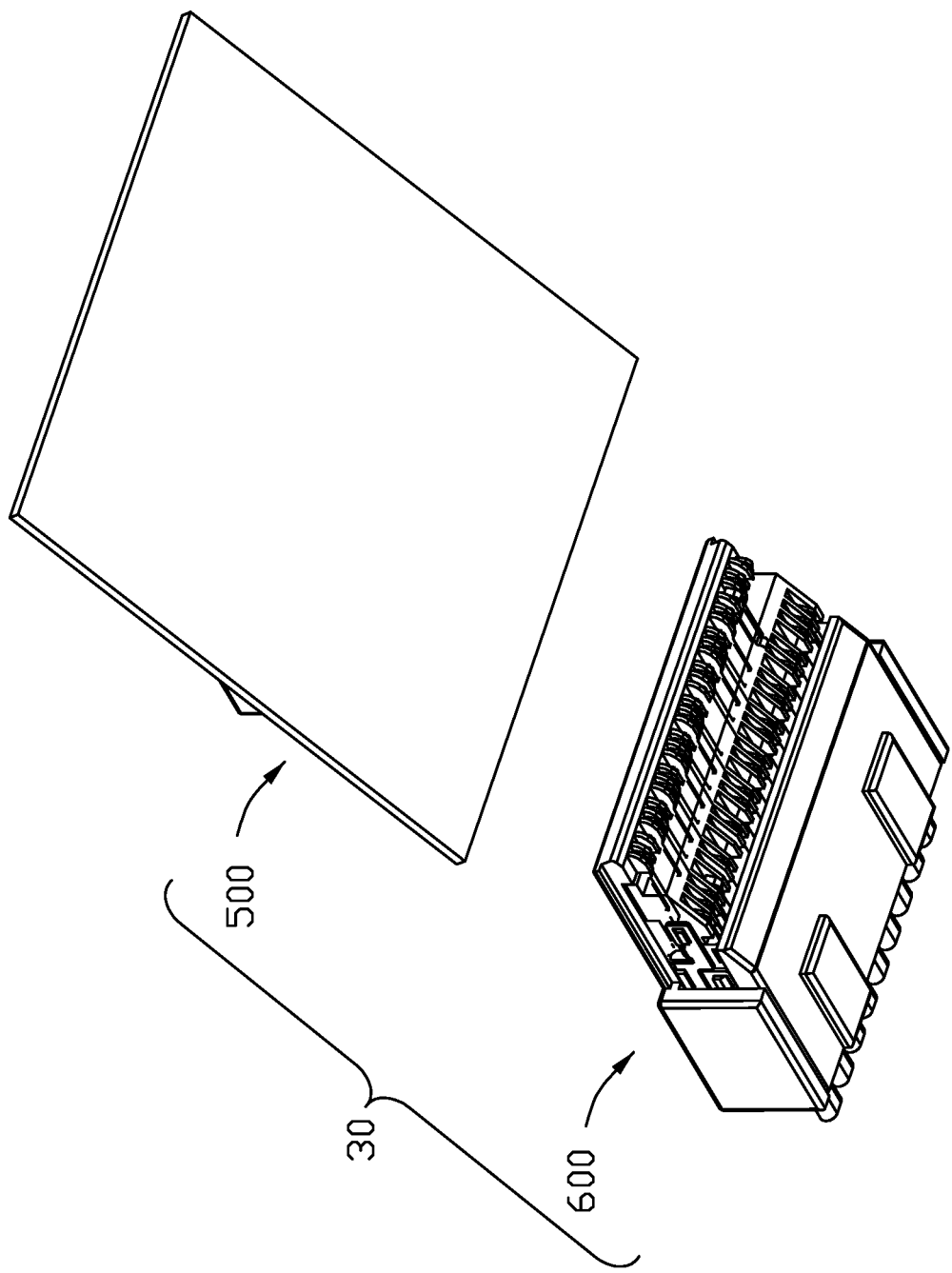
FIG. 7 is another perspective view of the electrical connector assembly of FIG. 6.
Figure 8:
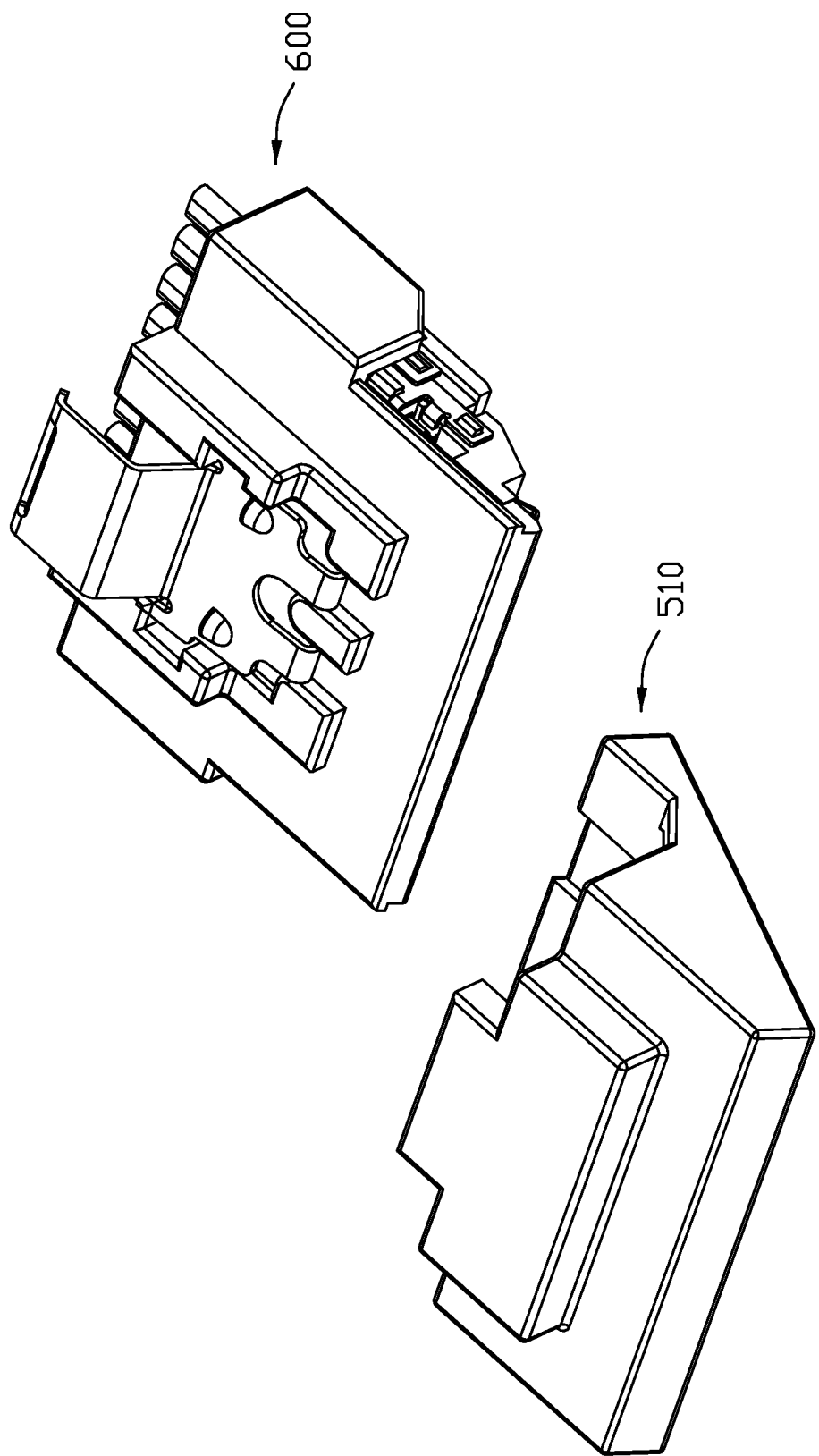
FIG. 8 is a perspective view of the electrical connector assembly of FIG. 3 wherein the plug connector and the receptacle connector are separated from each other.
Figure 9:
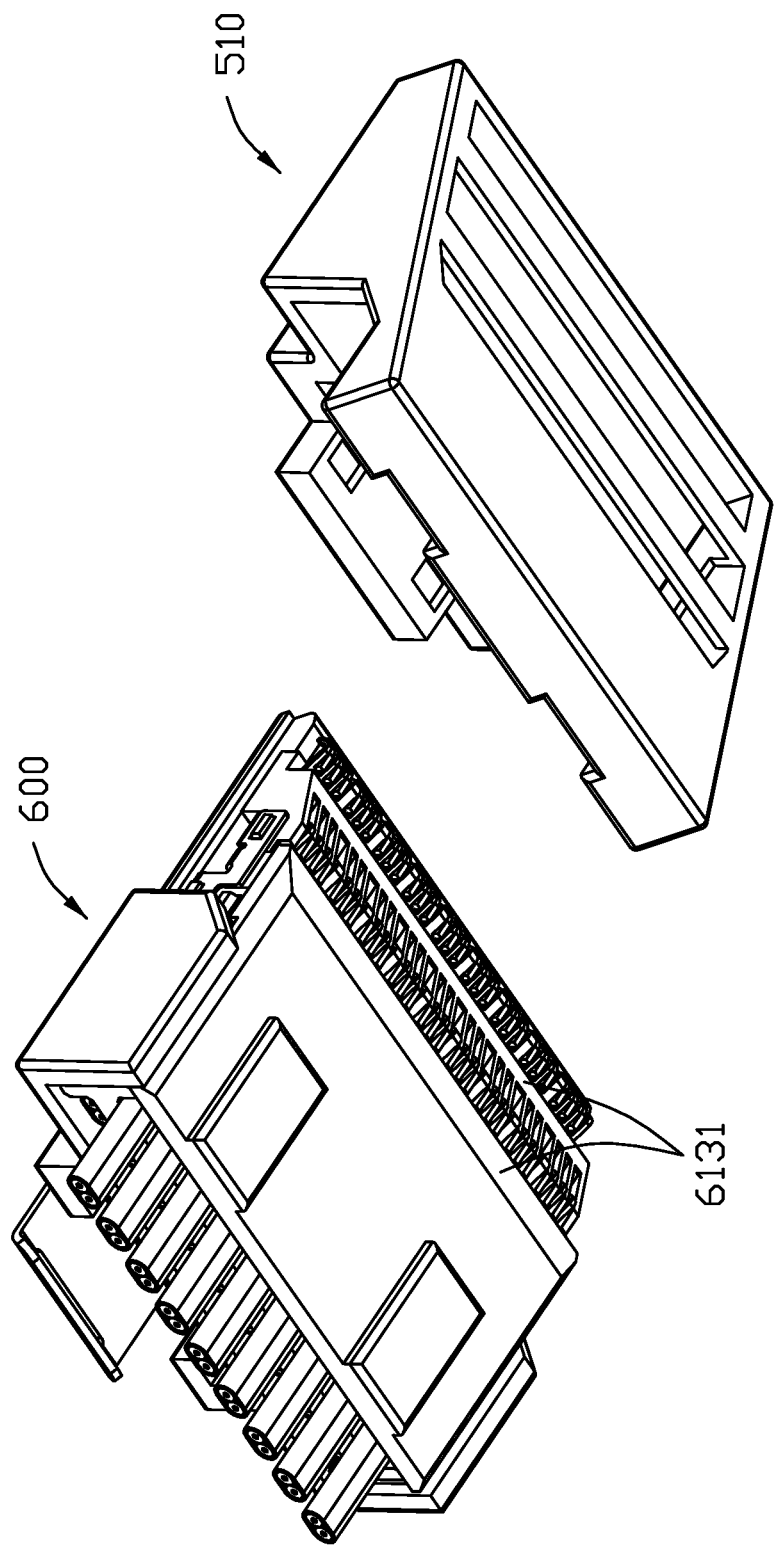
FIG. 9 is another perspective view of electrical connector assembly of FIG. 8.

Referring to FIGS. 1-26, an electrical connector assembly 30 includes a plug connector 600 and a receptacle connector sub-assembly 500 which are adapted to be mated with each other. The receptacle connector sub-assembly 500 includes a printed circuit board 550 and an insulative receptacle housing 510 mounted upon the printed circuit board 550. A plurality of conductive grounding pads 552 and a plurality of conductive signal pads 554 are formed on the printed circuit board 550. In this embodiment, two signal pads 554 and one grounding pad 552 are staggered with each other and the conductive pads are pattered in two pad rows 556. Two elongated grounding strips 557 are formed beside the grounding pads 552 and the signal pads 554, or each pad row 556. The insulative housing 510 forms a receiving space 512 downwardly communicating with the printed circuit board 550 via a pair of elongated openings 513 for confrontation with the corresponding conductive pads 552, 554, and upwardly and obliquely communicating with an exterior for receiving the plug connector 600. In the embodiment, as shown in FIGS. 4 and 5, the housing 510 includes a bottom wall 5151 parallel to and confronting with the printed circuit board 550, a lower oblique wall 5152 with an upward oblique face, an upper oblique wall 5153 and two end walls 5154 unitarily connecting with the bottom wall 5151 and the lower oblique wall 5152 and upper oblique wall 5153. Said walls commonly define said oblique extending receiving space 512, and the elongated openings 513 are defined on the bottom wall 5151. A pair of guiding recesses 514 are formed in the upward face of the housing 510, the guiding recesses 514 is on the upward face of the lower slant wall 5152. The upper oblique wall 5153 defined a retaining recess 5155 on the low face thereof.

Figure 11:
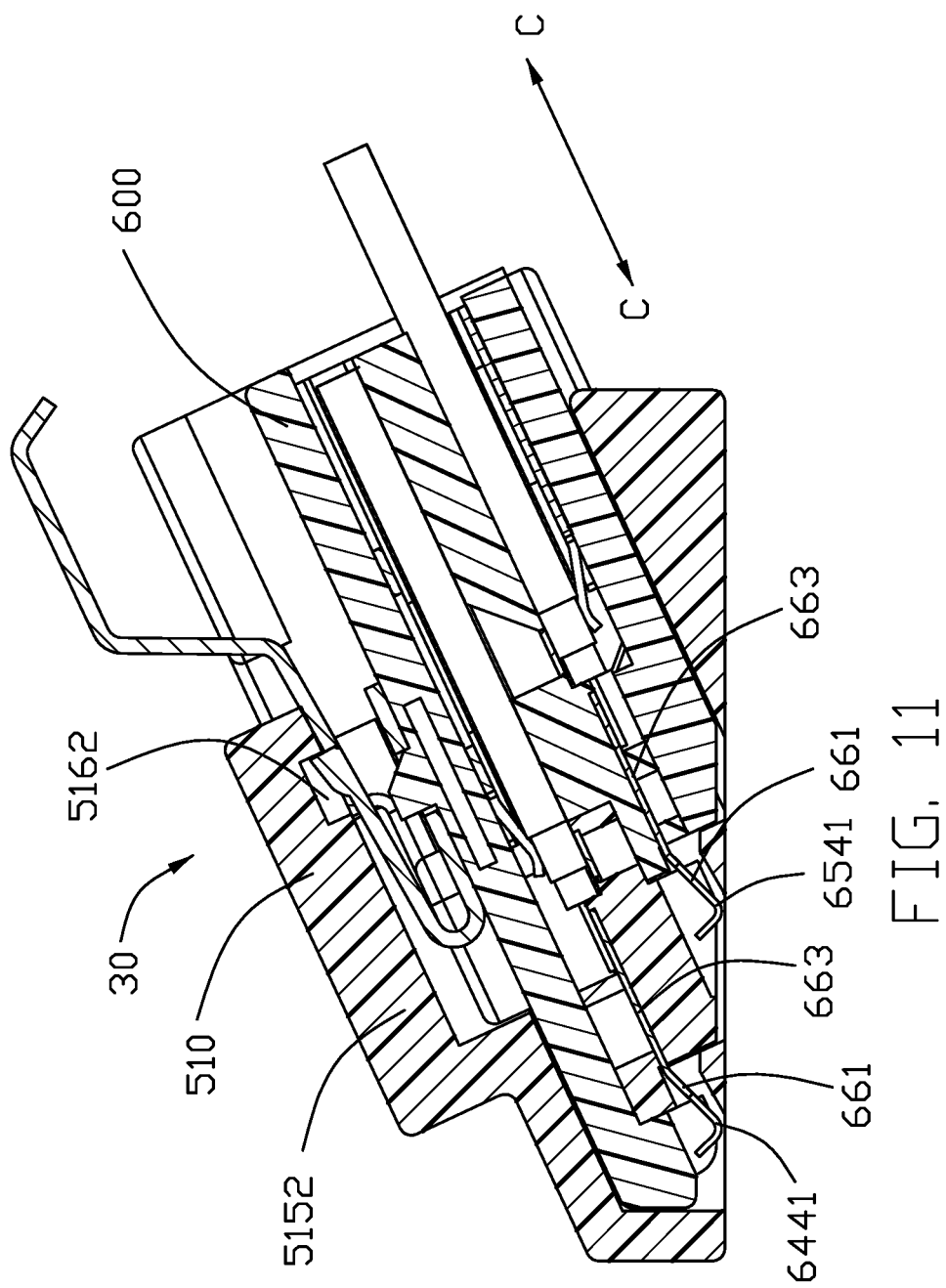
FIG. 11 is another cross-sectional view of the electrical connector assembly of FIG. 3 without showing the printed circuit board.
Figure 12:
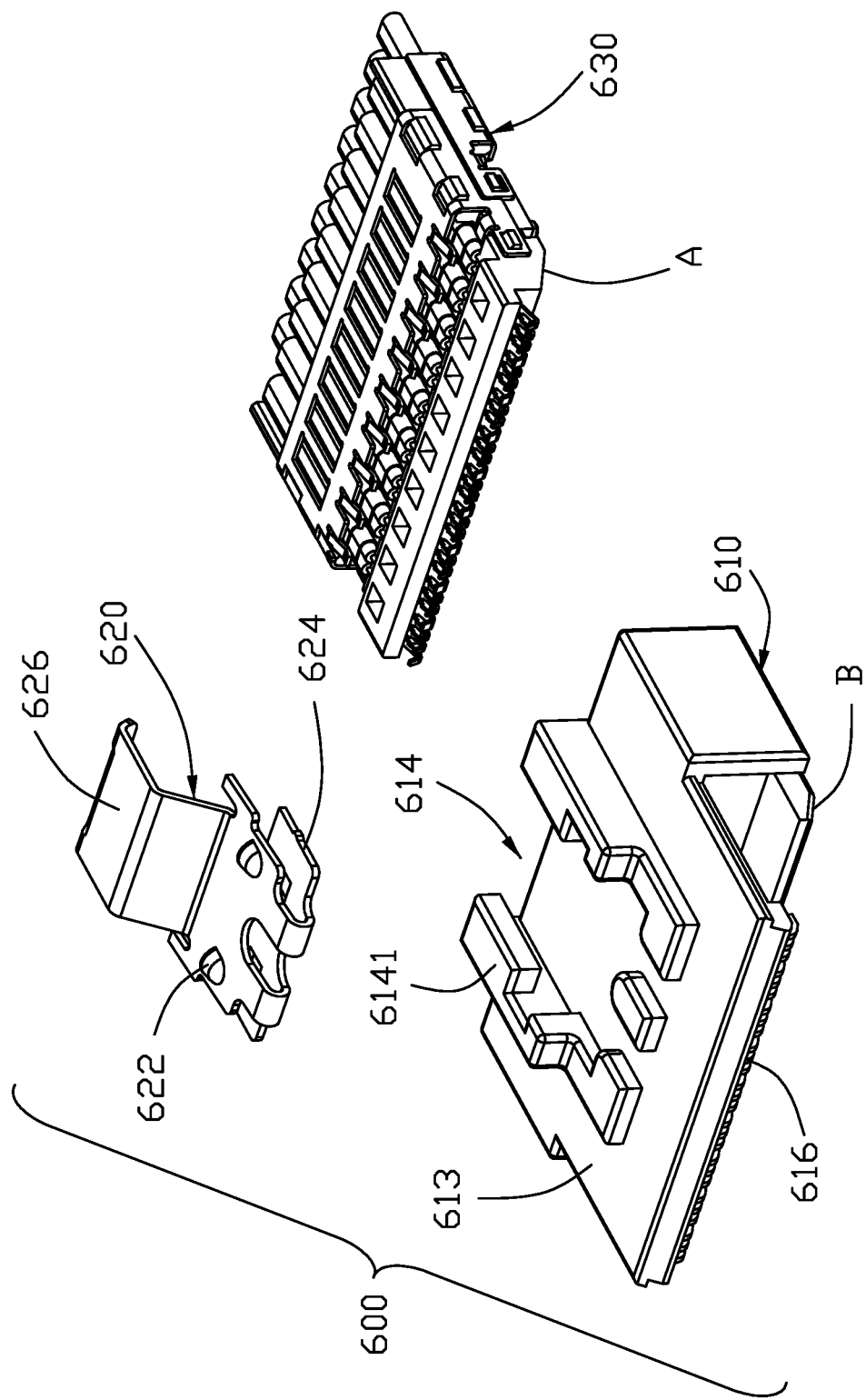
FIG. 12 is an exploded perspective view of the plug connector of FIG. 8.
Figure 13:
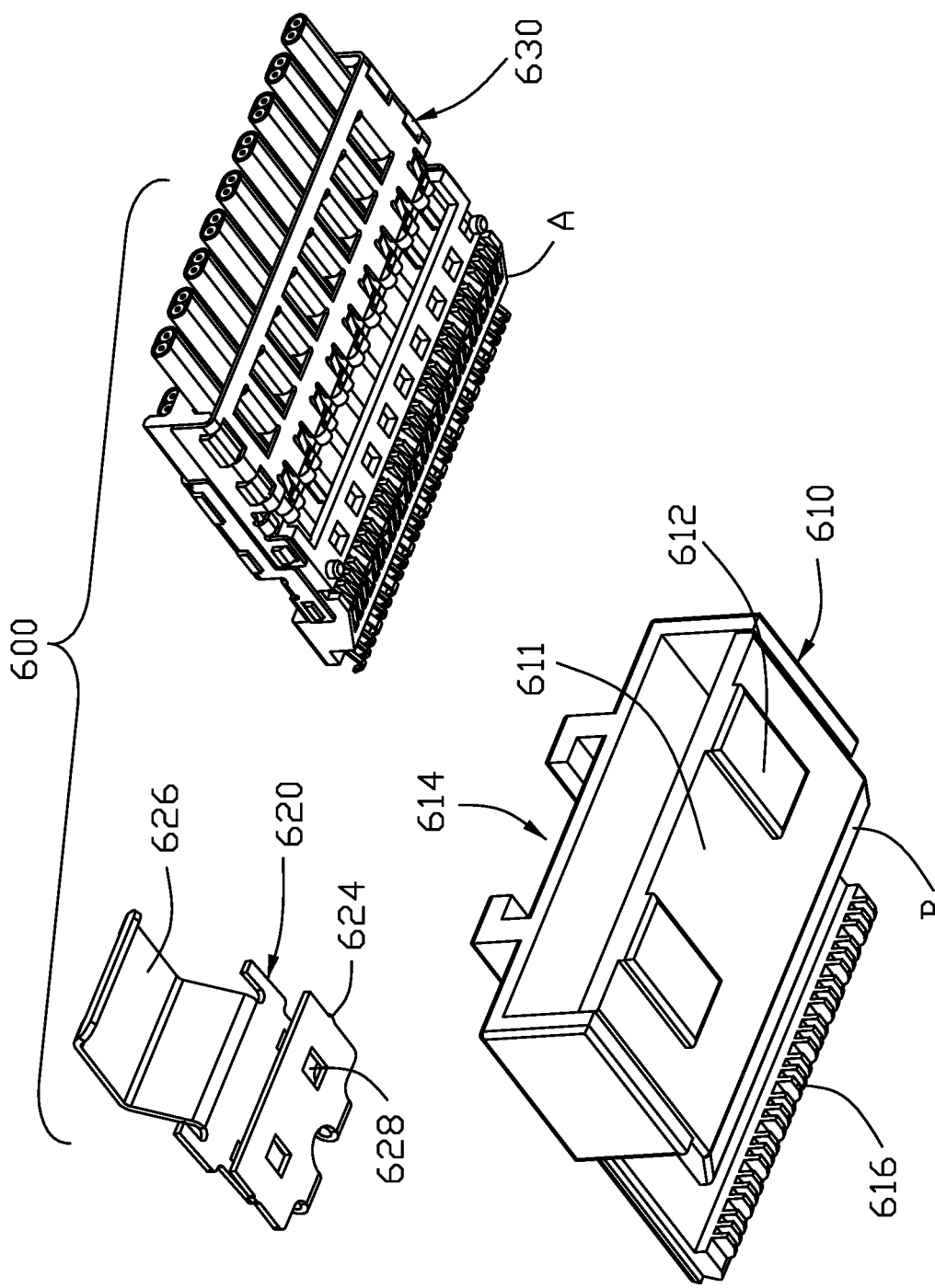
FIG. 13 is another exploded perspective view of the plug connector of FIG. 12.
Figure 14:
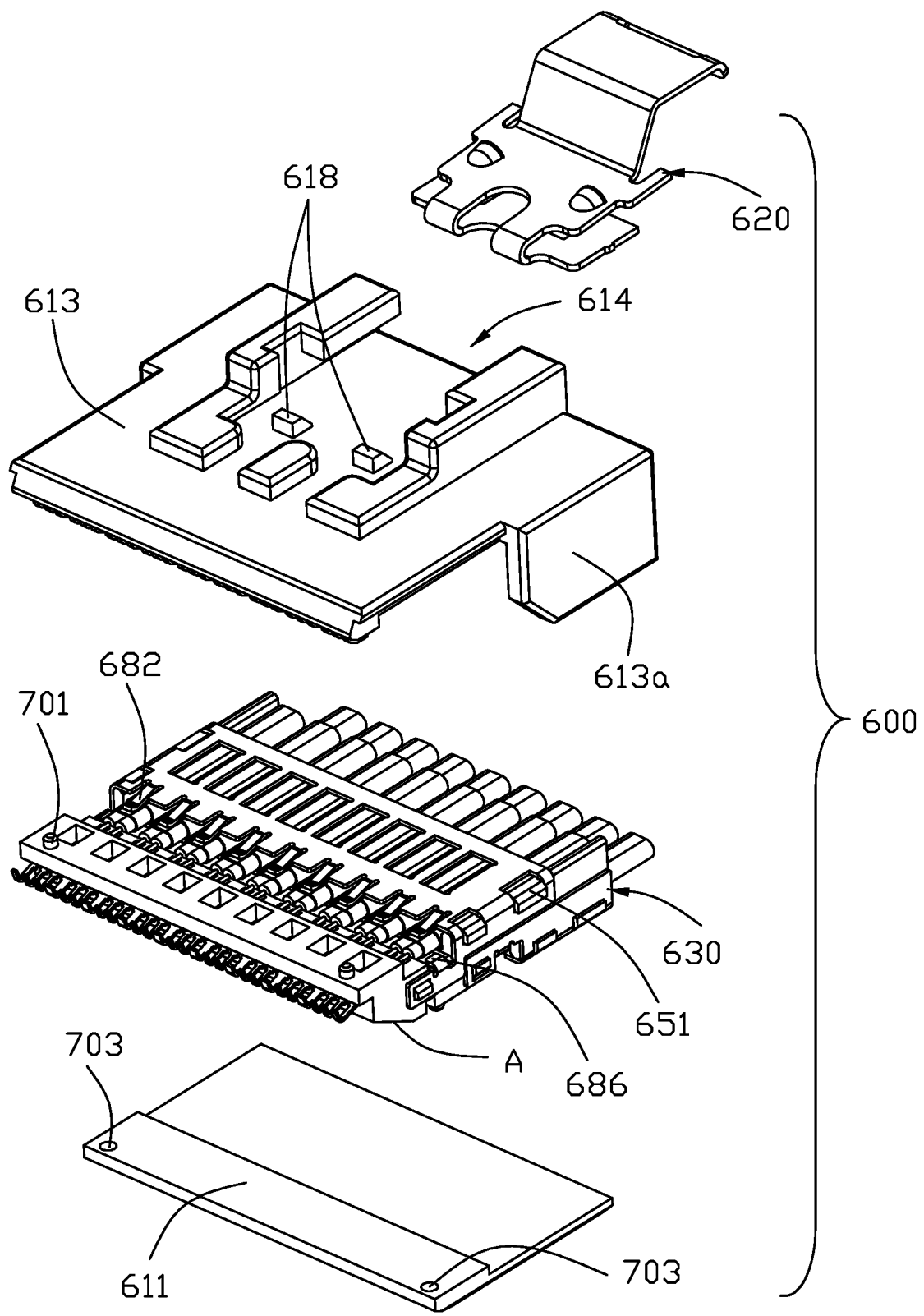
FIG. 14 is a further exploded perspective view of the plug connector of 12.
Figure 15:
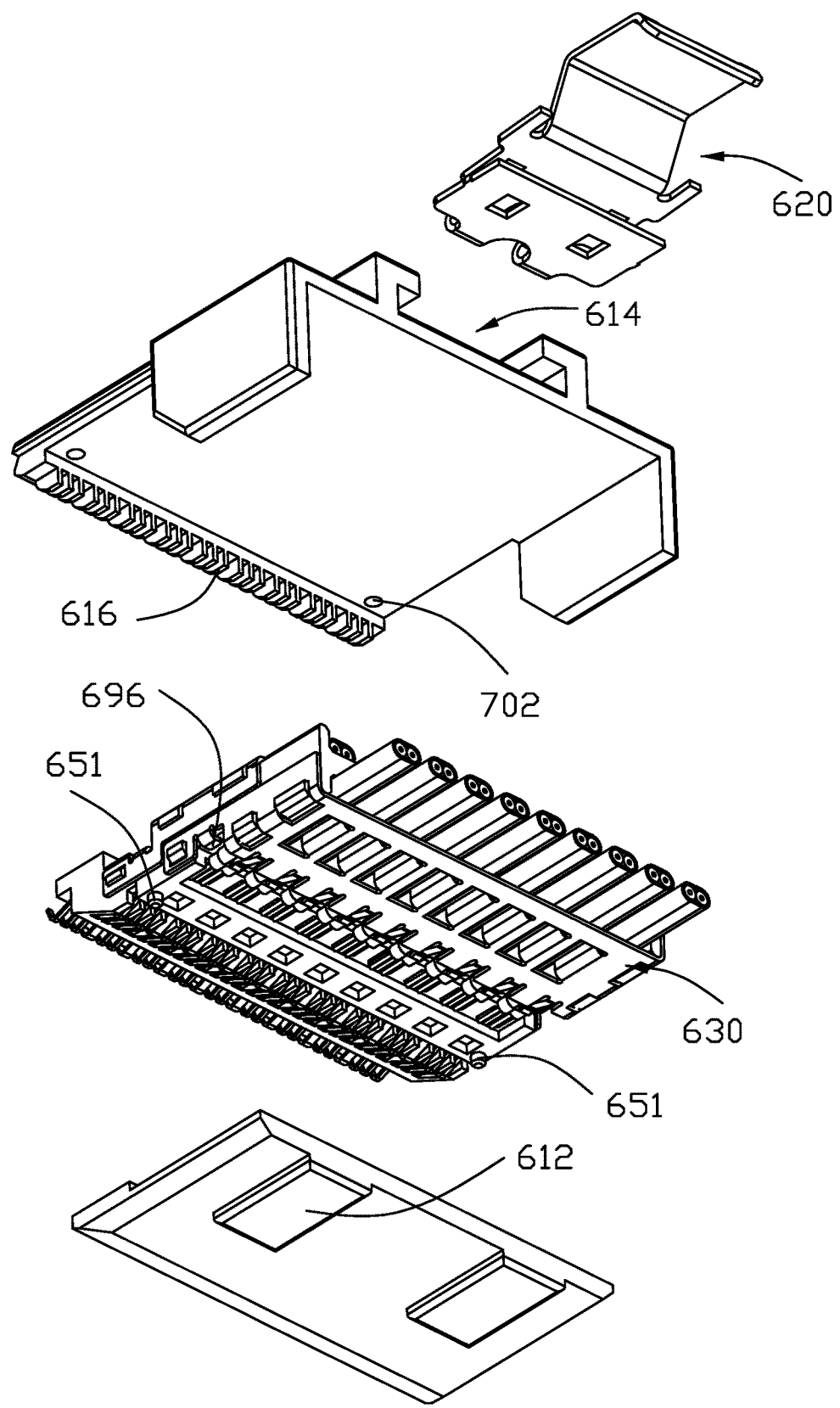
FIG. 15 is another exploded perspective view of the plug connector of FIG. 14.
Figure 16:
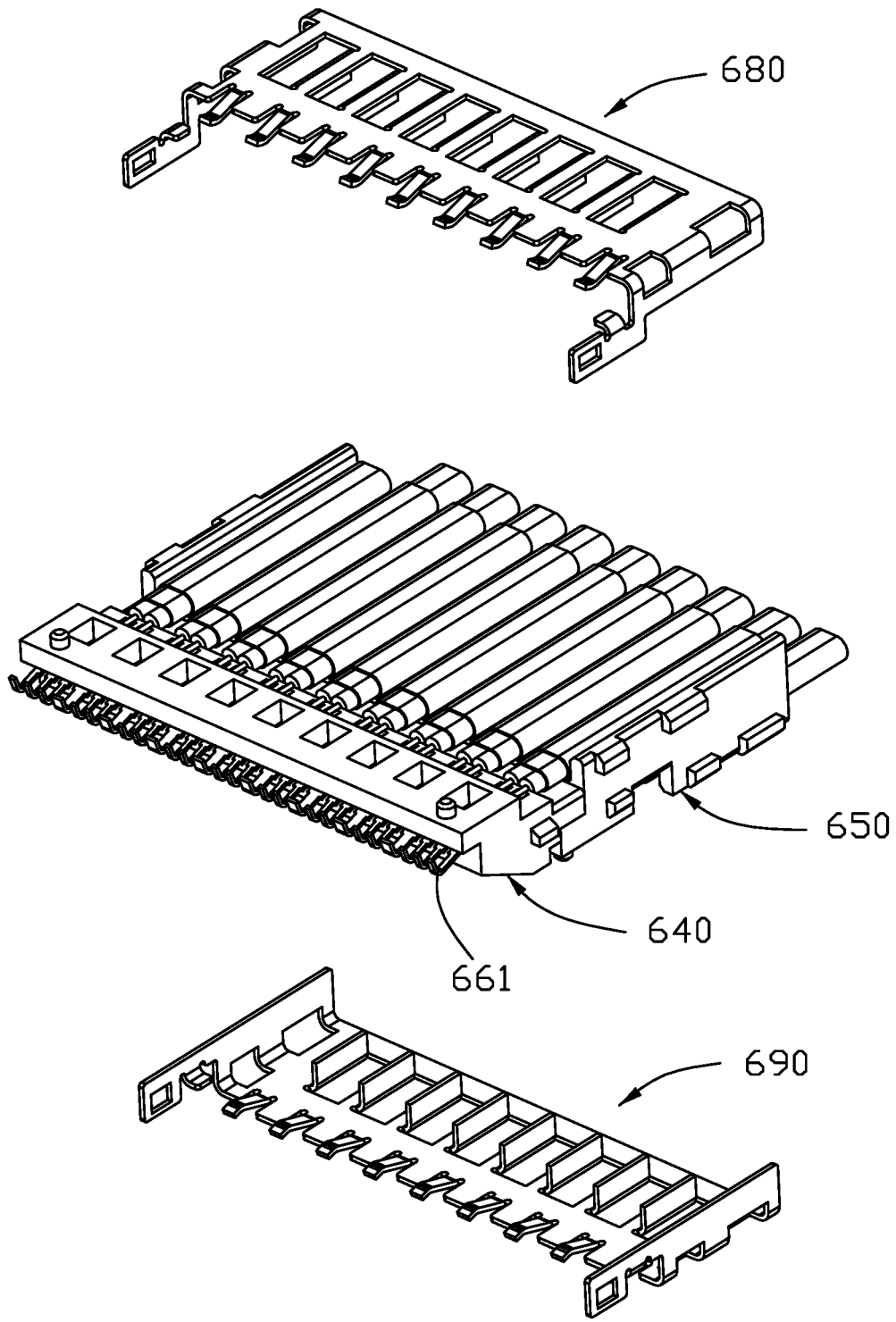
FIG. 16 is a further exploded perspective view of the contacting module and the grounding bars of FIG. 14.
Figure 17:
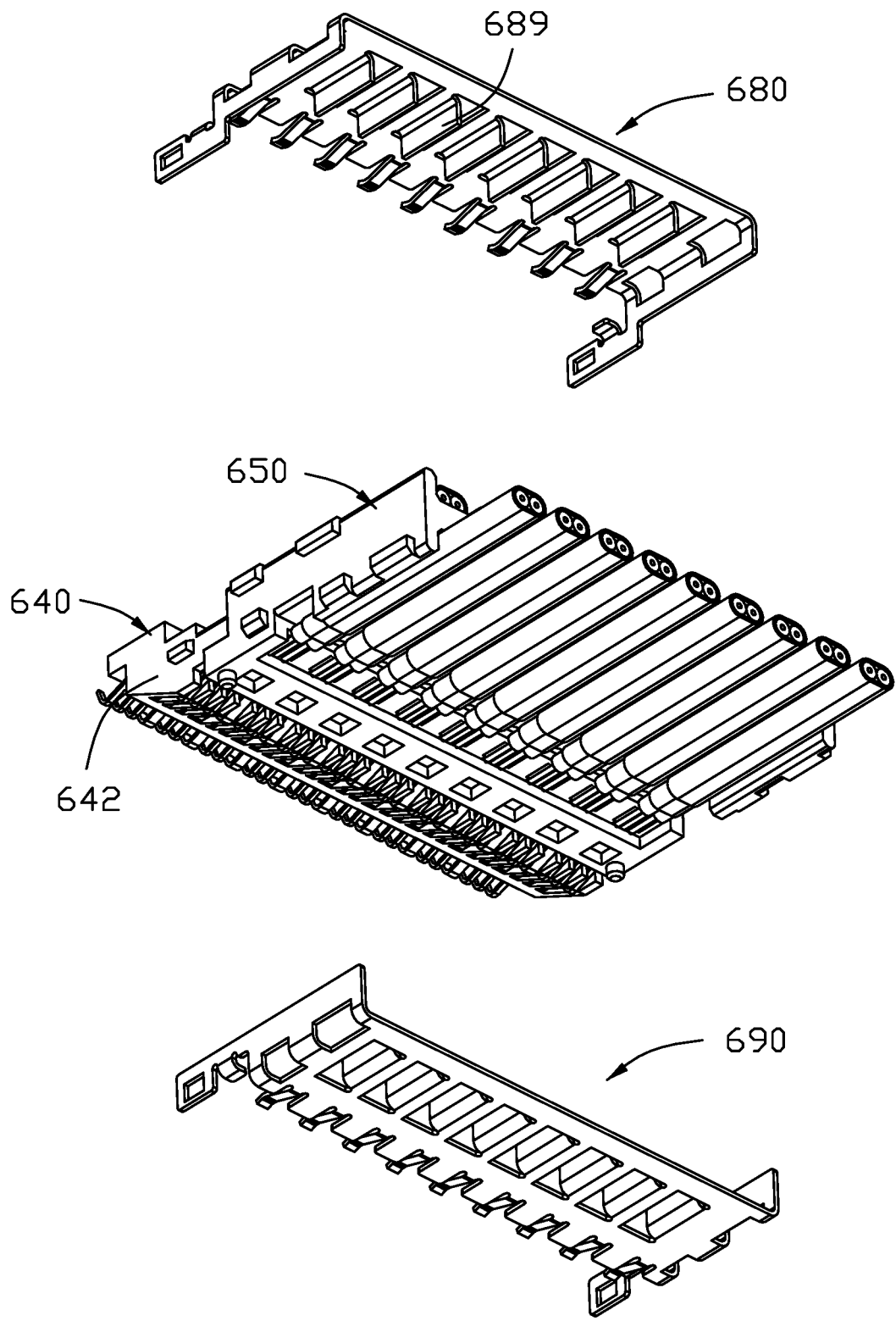
FIG. 17 is another exploded perspective view of the contacting module and the grounding bars of FIG. 16.
Figure 18:
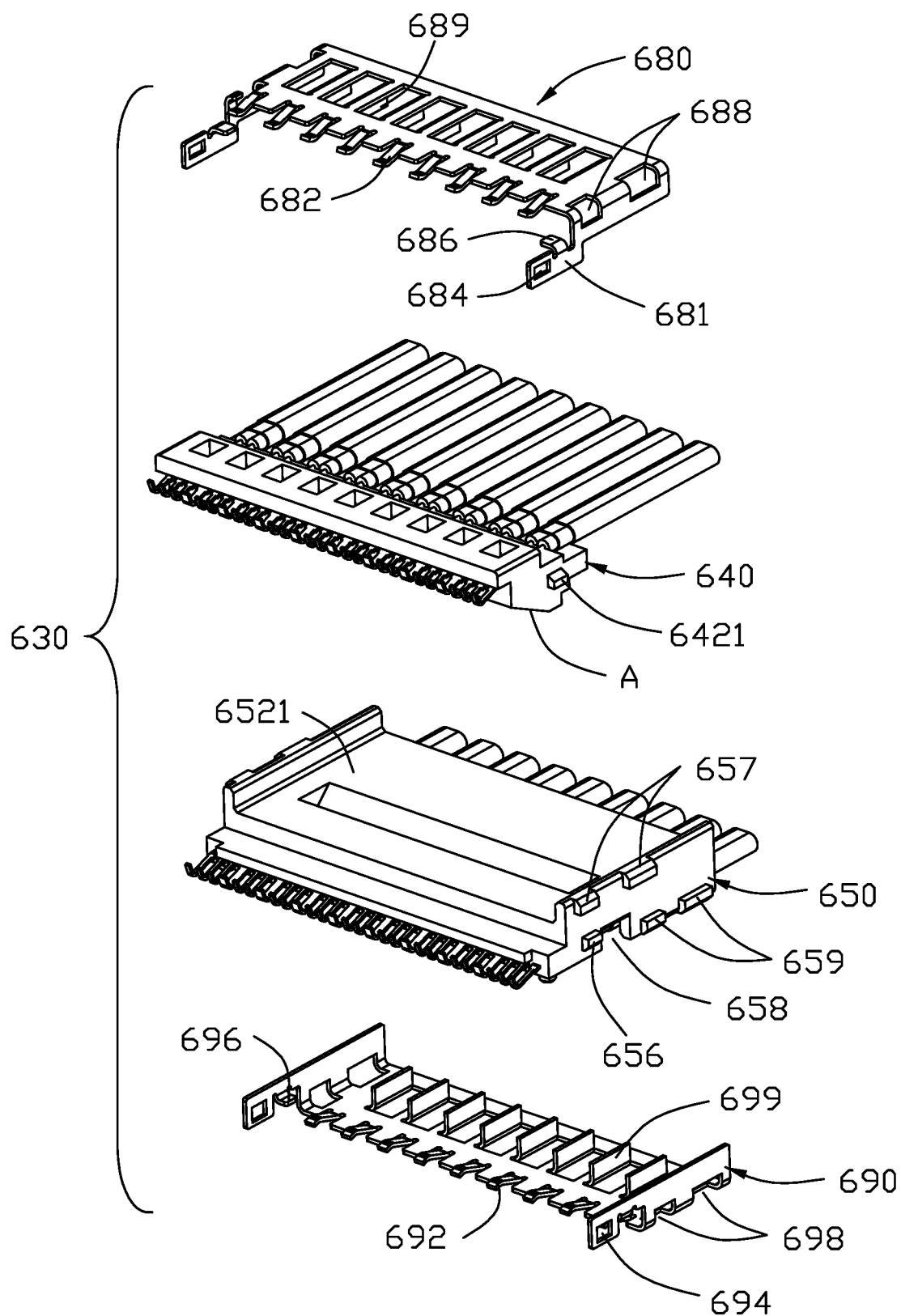
FIG. 18 is a further exploded perspective view of the contacting module and the grounding bars of FIG. 16.
Figure 19:
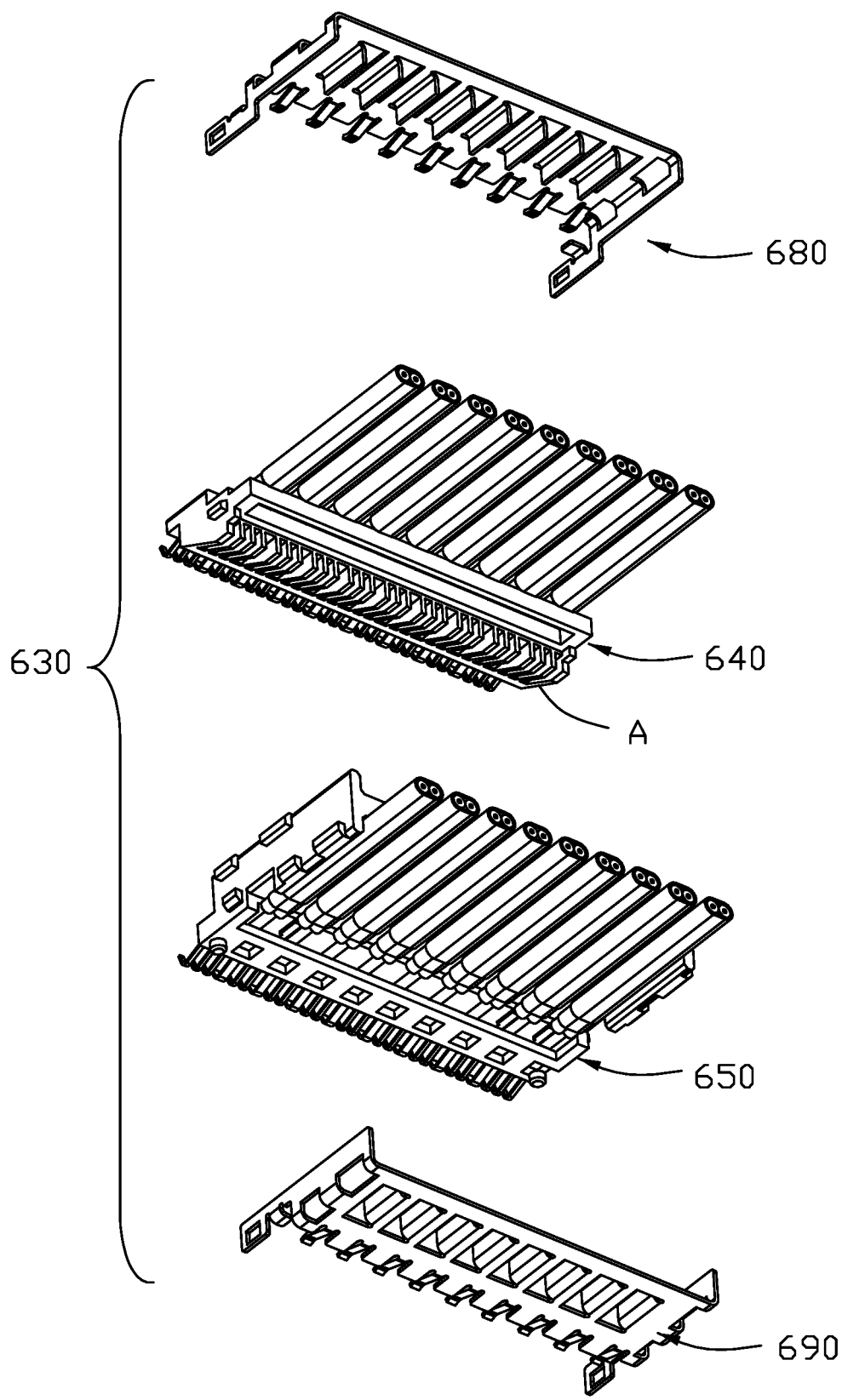
FIG. 19 is another exploded perspective view of the contacting module and the grounding bars of FIG. 18.
Figure 20:
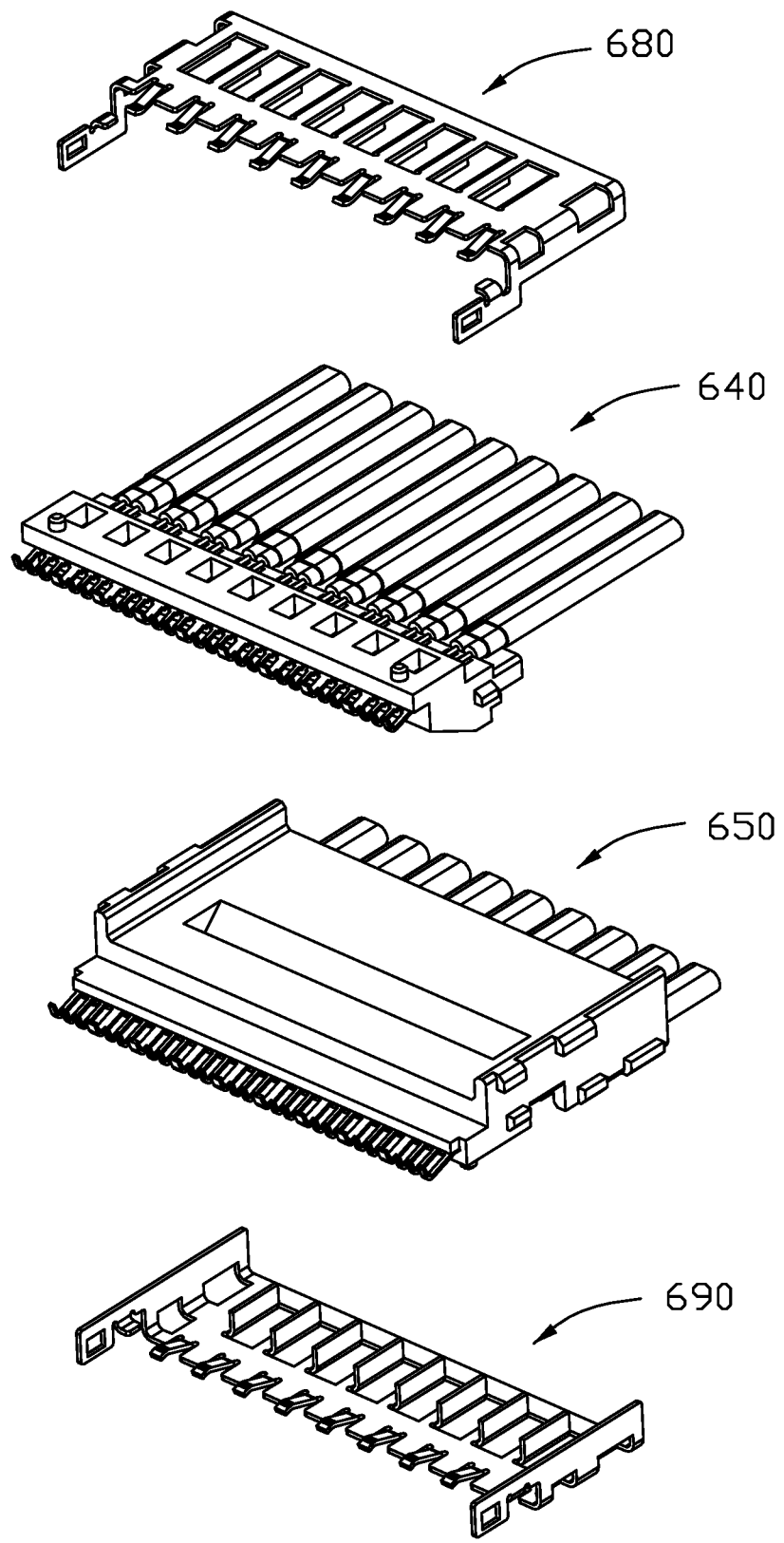
FIG. 20 is another exploded perspective view of the contacting module and the grounding bars of FIG. 18.
Figure 21:
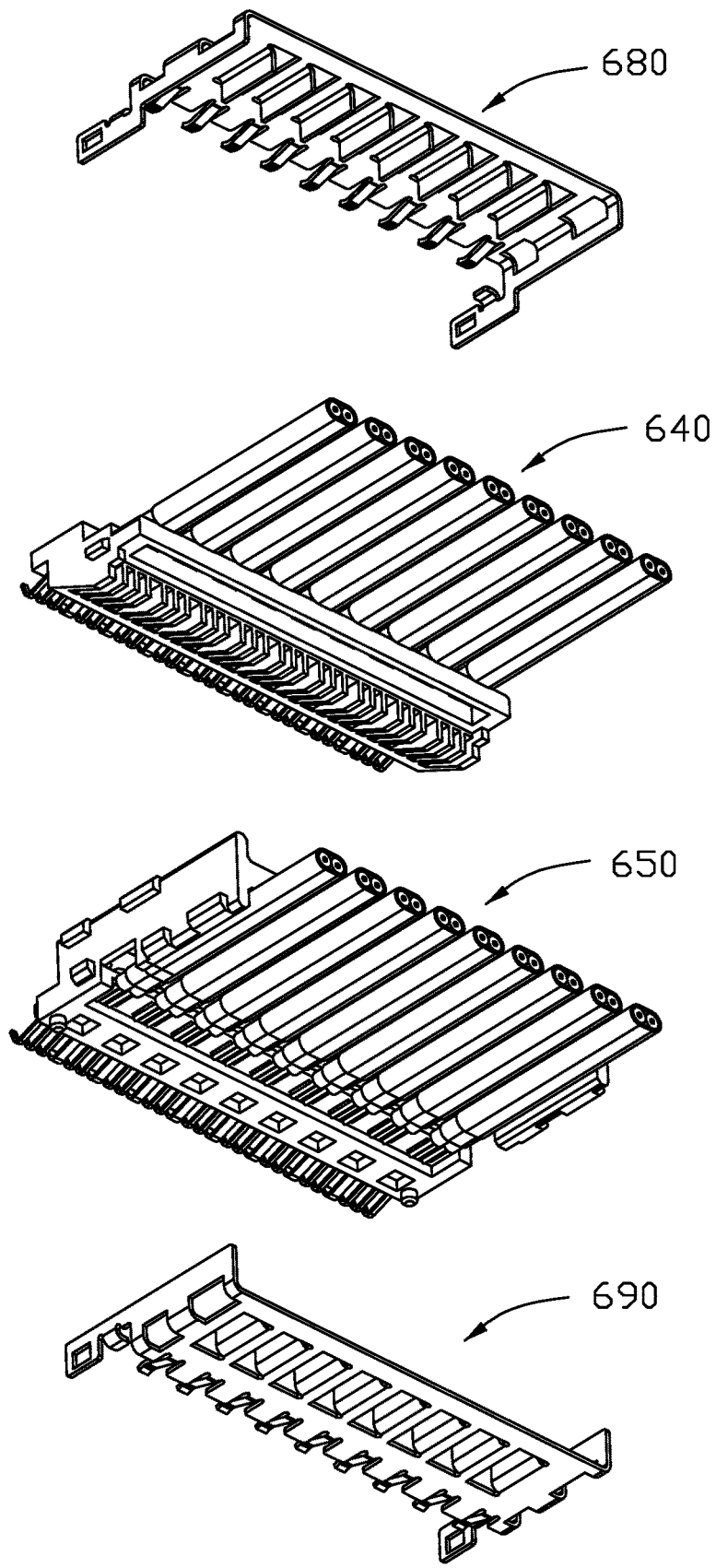
FIG. 21 is another exploded perspective view of the contacting module and the grounding bars of FIG. 18.
Figure 22:
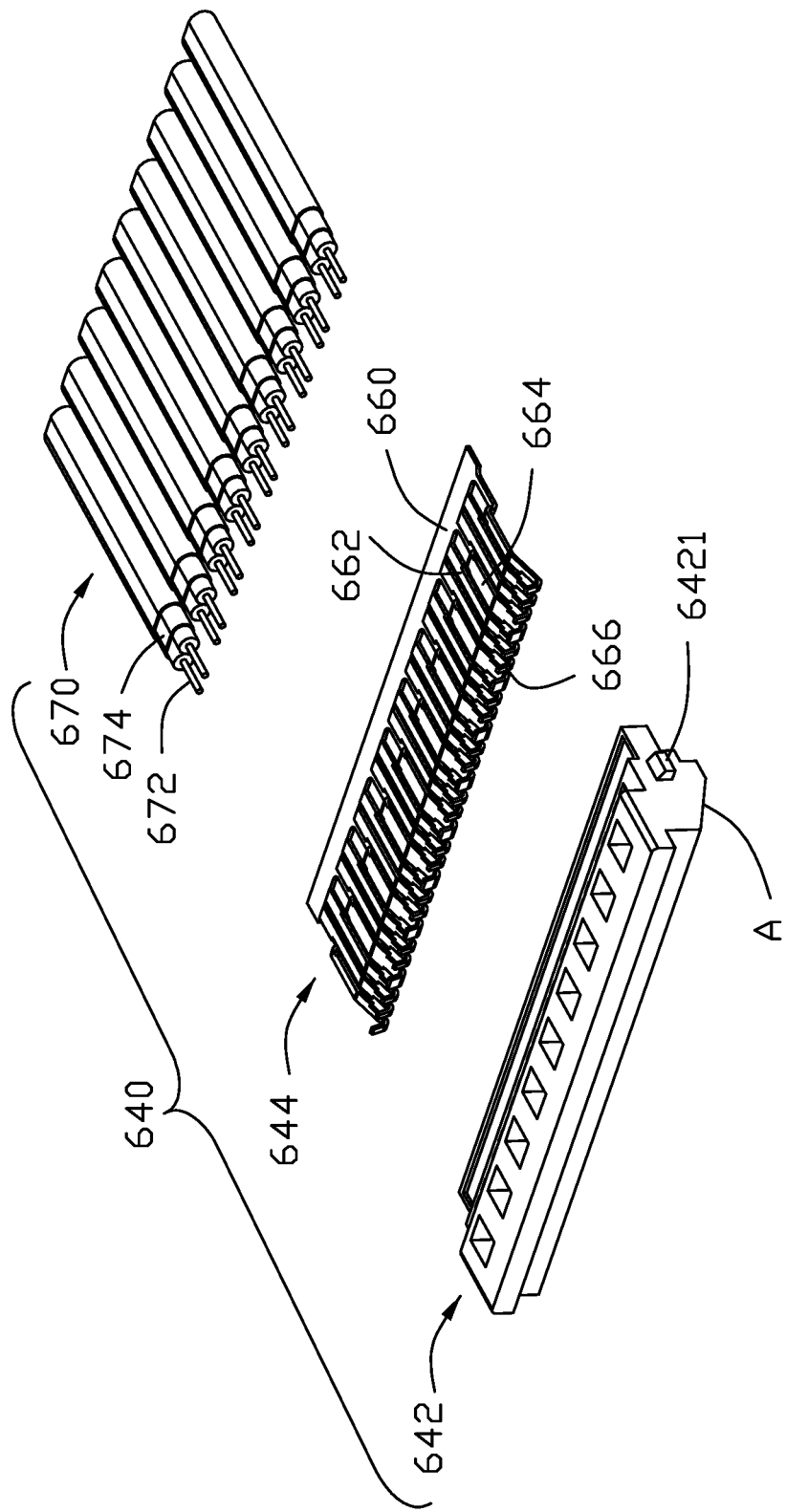
FIG. 22 is a further exploded perspective view of the upper unit of FIG. 18.
Figure 23:
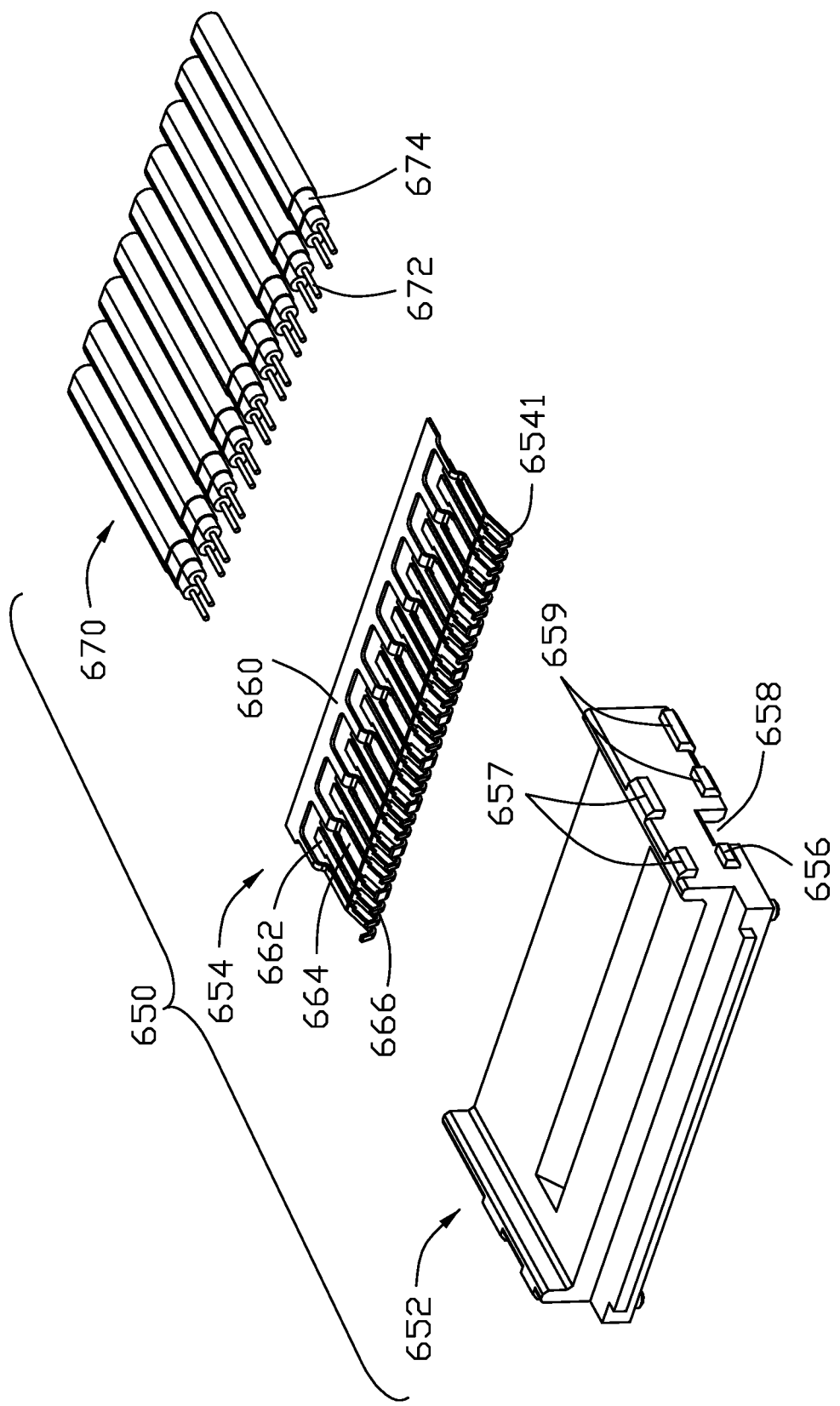
FIG. 23 is further exploded perspective view of the lower unit of FIG. 18.
Figure 24:
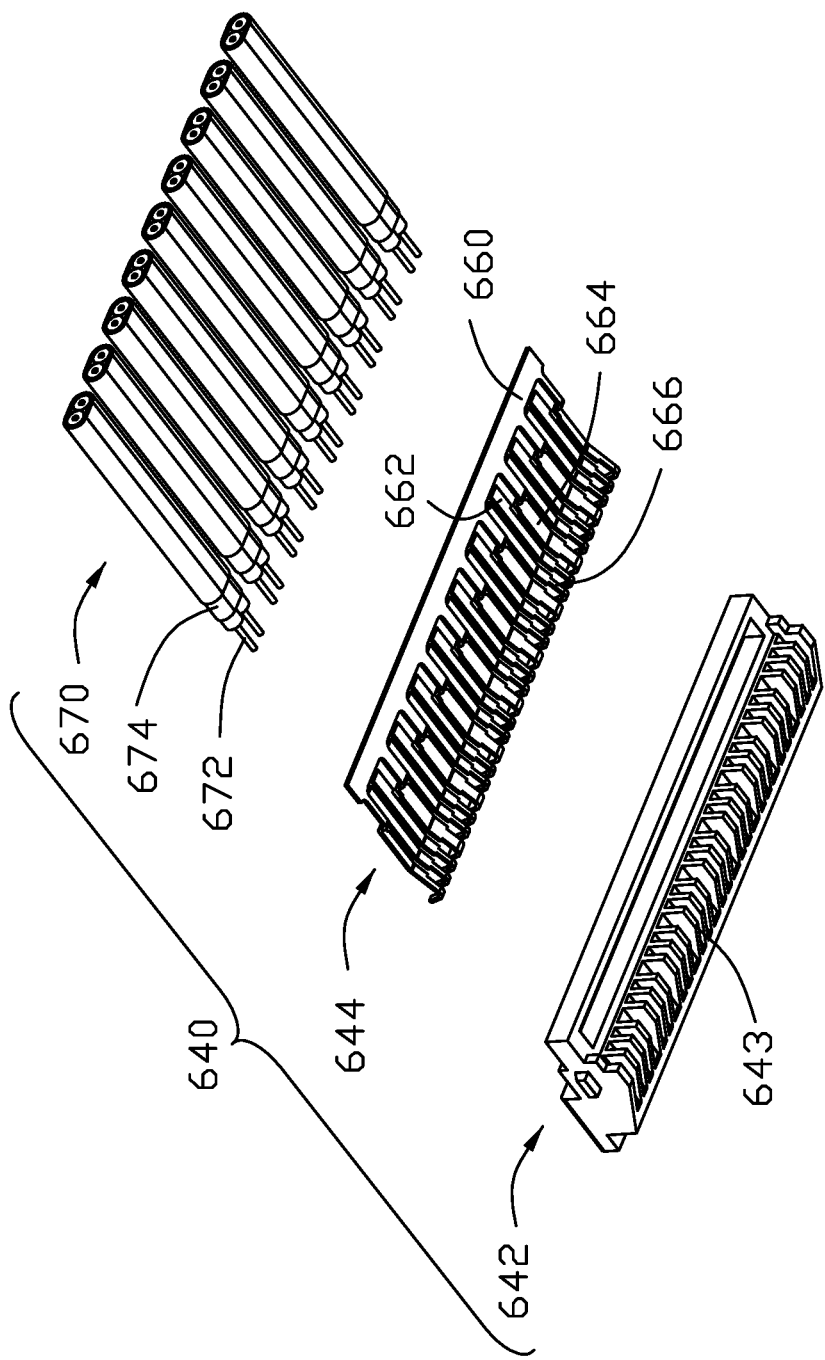
FIG. 24 is another exploded perspective view of the upper unit of FIG. 22.
Figure 25:
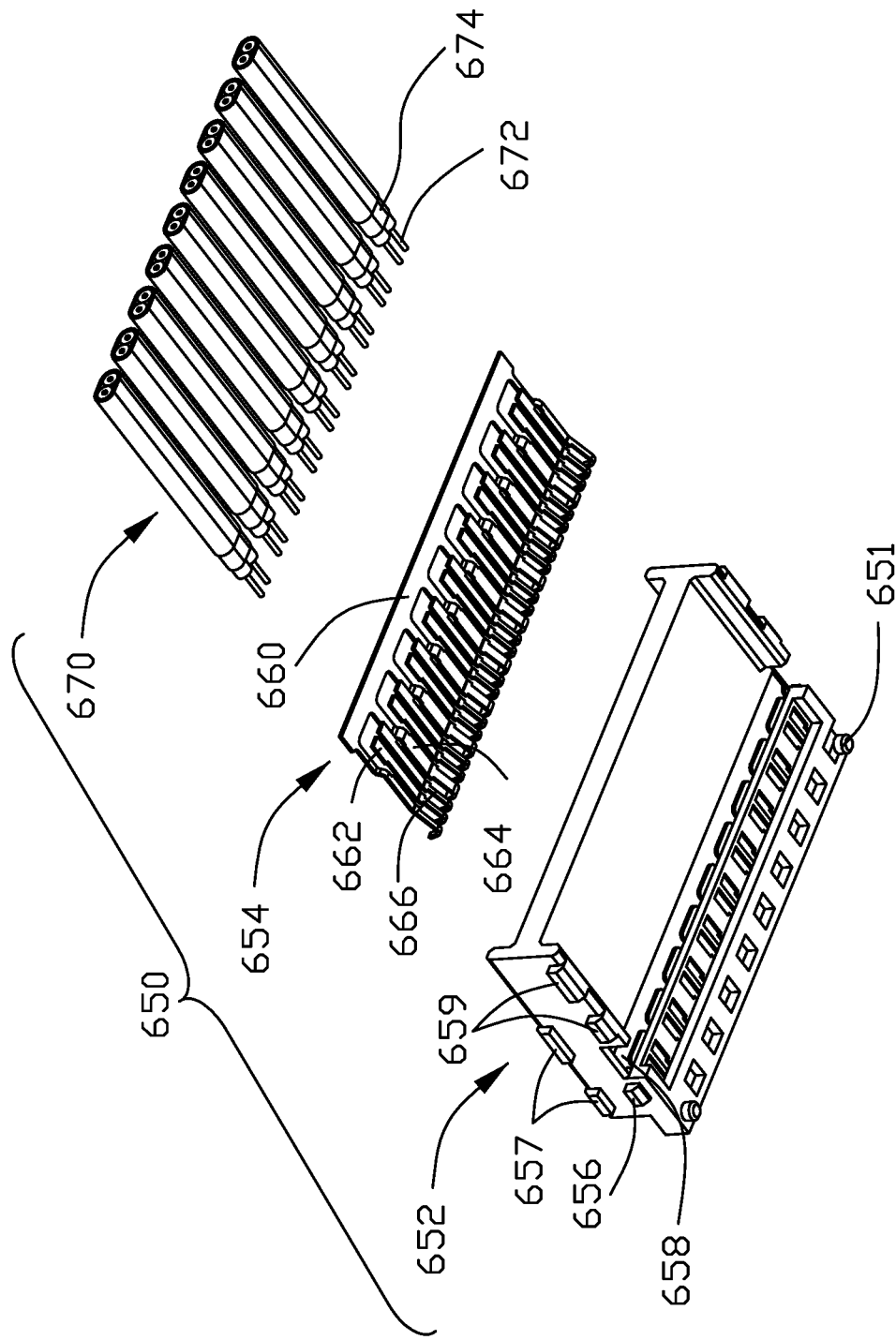
FIG. 25 is another exploded perspective view of the lower unit of FIG. 23.
Figure 26:
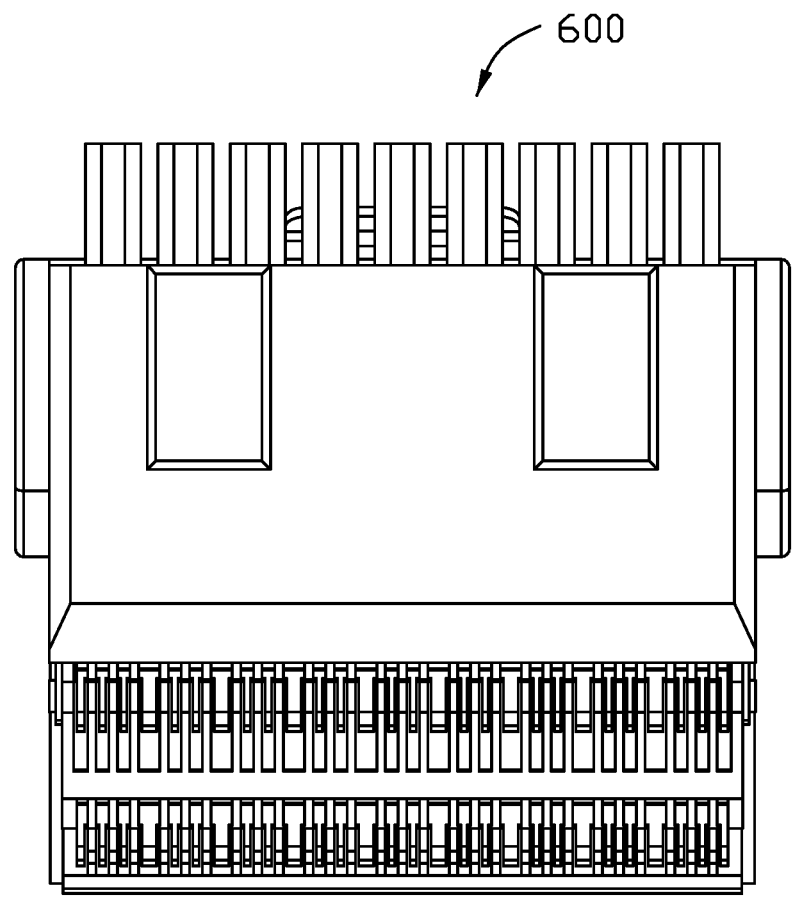
FIG. 26 is a bottom view of the plug connector of FIG. 1.

The plug connector 600 includes an insulative plug housing 610, a contact module 630 retained in the housing 610, and a latch 620 retained in a space 614 of the housing 10. The housing 610 includes a bottom plate 611 with a pair of protrusions 612 adapted to be received within the corresponding guiding recesses 514 during mating, and a top plate 613 parallel to the bottom plate 611. A chamfer B is formed on the bottom plate 611, which cooperate with the contact module 630 to define a mating face 6131. The space 614 surrounded with retaining ribs 6141 is defined on a top face of the top wall 613, the latch 620 includes a retaining plate 624 with side barbs 6241 for retaining to the housing 610 in the space 614. As best shown in FIG. 14, a pair of openings 628 are formed in the retaining plate 62, which can be receive the corresponding protrusions 618 the housing 610 as best shown in FIG. 14. The retaining plate 62 and the front portion of the deflectable arm are receiving in the space 614 and then are inserted in the retaining recess 5161. The deflectable arm 626 of the latch 620 includes a pair of locking lugs 622 for engagement with the corresponding locking holes 5162 in the upper slant wall 5152 of the housing 510, as shown in FIG. 11. The rear portion of the deflectable arm 626 extends beyond the space 614 and provides for an operation to release the latch 620 from the receptacle connector. A plurality of passageways 616 are formed in a front end region of the housing 610.

The insulative housing 610 can be of a one-piece or two pieces assembled together. In this embodiment, the bottom plate 611 defines a pair of holes 703 which are formed in an upper face of the bottom plate 611 for receiving the corresponding posts 651 of the contact module 630. The top plate 613 defines a pair of holes 702 which are formed in an undersurface of the top plate for receiving the corresponding posts 701 of the contact module 630. A pair of end plate 613a unitarily extend perpendicular from the top plate for commonly surrounding the contact module 630.

Figure 10:
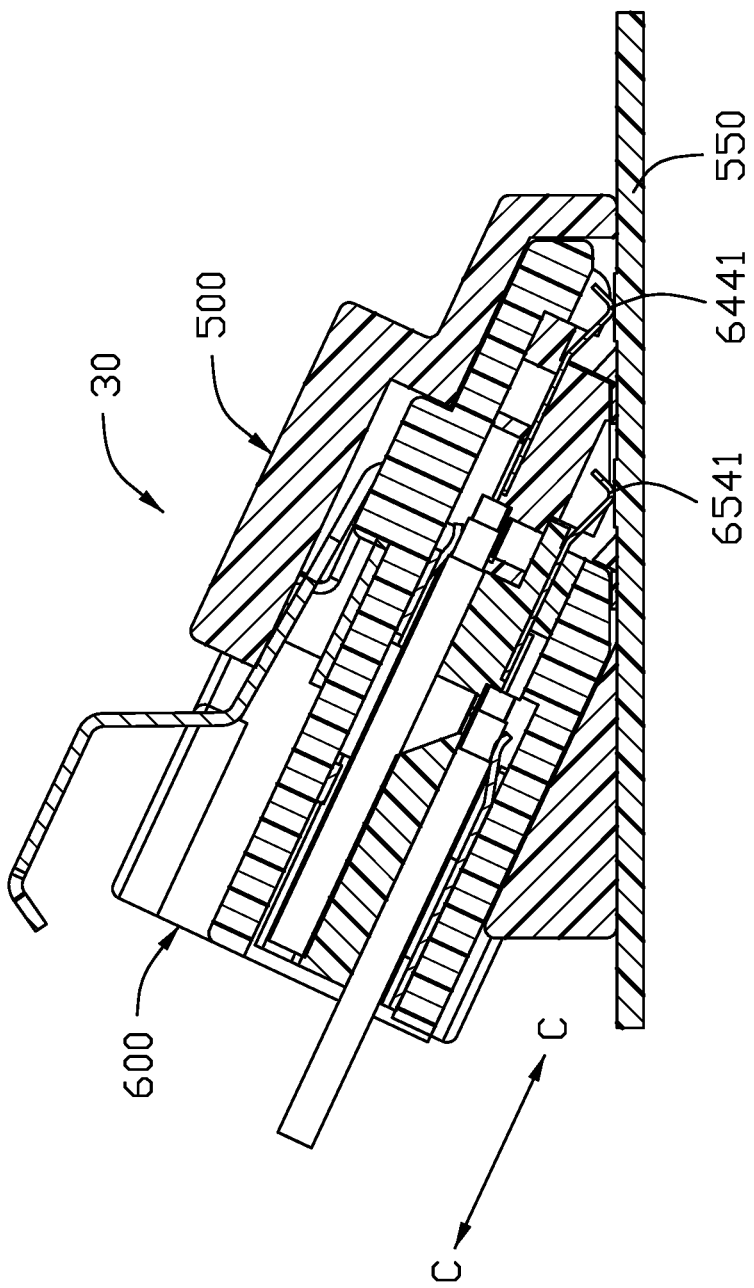
FIG. 10 is a cross-sectional view of the electrical connector assembly of FIG. 1.

The contact module 630 includes a front/upper unit 640 and a rear/lower unit 650 stacked with each other. The front/upper unit 640 includes a set of deflectable contacts 644 integrally formed within an insulator 642 via insert-molding. The insulator 642 forms a chamfer A coplanar with the chamfer B to be defined as the mating face 6131 when assembled with the housing 610. The insulator 642 forms a plurality of passageways 643. The contacts 644 includes a plurality of grounding contacts 664 and a plurality of differential pair contacts 666 alternately arranged with each along the longitudinal direction. The contacting sections 661 of the contacts 644 explodes in front of the insulator 642 and are received within the corresponding passageways 616 defined on the top plate 613, the contacting sections 661 slant downward with arc contacting points. As best shown in FIGS. 10 and 11, the contacting sections 661 of the contacts extend slantwise offset the extending direction of the plug connector from the retaining sections retained in the insulator, and the contacting sections 661 provide with lowest points 6611 for contacting with a receptacle connector in which the plug connector is inserted. The soldering sections 662 of the differential pair contacts 666 are soldered to the inner conductors 672 of the corresponding wires 670. The grounding contacts 664 are unified together via a transverse bar 660. The shielding/braiding layers 674 of the wire 670 are mechanically and electrically connected to the transverse bar 660. A metallic grounding bar 680 is secured upon the insulator 642. The grounding bar 680 forms spring tangs 682 extending from a front edge thereof and contacting the braiding layers 674 of the corresponding wires 670. A pair of end arms 681 extend forward with holes 684 and abutting against the insulator 642. The holes 684 defined on the end arms 681 receive the corresponding protrusions 6421 of the insulator 642. The holes 688 receive protrusions 657 defined on the insulator 652 of the rear/lower unit 650. The tabs 686 abut against or optionally soldered upon the transverse bar 660 in the vertical direction. A plurality of tabs 689 associated with the corresponding openings are formed on the grounding bar 680 for separating the wires 670. This angled plug connector has eighteen pair of differential-pair contacts and each adjacent contacts has a 0.5 mm pitch.

Similarly, the rear/lower unit 650 includes a set of deflectable contacts 654 integrally formed within an insulator 652. The insulator 652 forms protrusions 656, 657 and 659, and recesses 658. The protrusions 657 are received within the holes 688 of the grounding bar 680 of the front/upper unit 640. The contacts 654 include a plurality of grounding contacts 664 and plurality of differential pair contacts 666 are alternately arranged with each other in the longitudinal direction. The contacting sections 6541 of the contacts 654 are received within the corresponding passageways 643. The soldering sections 662 of the differential pair contacts 666 are soldered to the inner conductors 672 of the corresponding wires 670. All grounding contacts 664 are unified together via a transverse bar 660. The braiding layers 674 of the wires 670 are mechanically and electrically connected to the transverse bar 660. A metallic grounding bar 690 forms openings 694 for receiving the protrusions 656, openings 698 for receiving the protrusions 659, tabs 696 received within the corresponding recess 658 and abutting against the transverse bar 660, the spring tabs 692 mechanically and electrically connecting the braiding layers 674 of the corresponding wires 670, and a plurality of partitions 699 for separating the wires 670. The plug contact module defining an oblique mating interface relative to an extending direction C-C of the plug connector As shown in FIGS. 10-11, during mating via downwardly inserting the plug connector 600 into the housing 510 of the receptacle connector 500, the contacting sections of the contacts 644 and 654 of the plug connector 600 are mated with the corresponding conductive pads 552, 554 on the printed circuit board 550. The chamfer A of the contact module 630 and the chamfer B of the housing 610 are parallel to the printed circuit board 550. The features of this embodiment include the plug/cable connector with an oblique interface relative to the extending direction of the plug connector and obliquely inserted into an obliquely oriented receptacle connector in an obliquely extending manner wherein the contacts of the receptacle connector may be replaced with the conductive pads on the printed circuit board on which the housing of the receptacle connector is mounted as shown in the third embodiment, or retained to the housing of the receptacle connector and soldered to the printed circuit board on which the housing of the receptacle connector is mounted as disclosed in the first and second embodiments. Notably, the wires 670 of the front/upper unit 640 are located on an upper face of the insulator 652 while the wires 670 of the rear/lower unit 650 are located on an undersurface of the insulator 652. As shown in FIG. 11, when mated, the front end portion of the plug connector obliquely and downwardly abuts against the bottom wall 5151 of the receptacle housing for assuring the true position of the plug connector without vibration.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:
1. An electrical connector assembly comprising:
   a plug connector comprising:
      a plug housing enclosing a contact module therein, the plug contact module defining an oblique mating interface relative to an extending direction of the plug connector, the plug contact module including a plurality of plug contacts integrally formed within a plug insulator; and
      a plurality of wires extending rearwardly from the plug housing and electrically connected to corresponding plug contacts, respectively; and
   a receptacle connector comprising:
      a receptacle housing defining an oblique extending mating space to receive the plug connector which is inserted into the oblique extending mating space in an oblique direction; and
      a plurality of receptacle contacts located around a bottom face of the receptacle housing and mated with the plug contacts, respectively.
2. The electrical connector assembly as claimed in claim 1, wherein the plug connector is equipped with a resilient latch to be detachably engaged within the receptacle housing.

3. The electrical connector assembly as claimed in claim 1, wherein the plug contacts include a plurality of grounding contacts and a plurality of differential pair contacts alternately arranged with each other along a longitudinal direction, said grounding contacts are unified together via a rear transverse bar, and braiding layers of the wires are mechanically and electrically connected to the transverse bar.
4. The electrical connector assembly as claimed in claim 1, wherein one of the plug housing and the receptacle housing forms a protrusion, and the other of the plug housing and the receptacle housing forms a guiding recess to receive the protrusion for guiding insertion of the plug housing into the receptacle housing.
5. The electrical connector assembly as claimed in claim 1, wherein the plug housing forms a chamfer in parallel to the oblique mating interface.
6. The electrical connector assembly as claimed in claim 1, wherein an insulator of the plug contact module forms a chamfer parallel to the oblique mating interface.
7. The electrical connector assembly as claimed in claim 1, wherein the receptacle contacts are conductive pads formed on a printed circuit board on which the receptacle housing is seated.
8. The electrical connector assembly as claimed in claim 7, wherein the extending direction of the plug connector is oblique to the printed circuit board.
9. The electrical connector assembly as claimed in claim 7, wherein the receptacle housing forms an opening to upwardly expose the conductive pads toward the plug contacts.
10. The electrical connector assembly as claimed in claim 1, wherein the plug contact module includes a front/upper unit and a rear/lower unit stacked with each other, the front/upper unit including a plurality of front plug contacts integrally formed within an upper insulator and the rear/lower unit including a plurality of rear plug contacts integrally formed within a lower insulator.
11. The electrical connector assembly as claimed in claim 10, wherein the plug housing forms a plurality of passageways to receive contacting sections of the front plug contacts, and the upper insulator forms a plurality of passageways to receive contacting sections of the rear plug contacts.
12. The electrical connector assembly as claimed in claim 10, wherein the wires connected to the front plug contacts are located on an upper surface of the lower insulator while the wires connected to the rear plug contacts are located on an undersurface of the lower insulator.
13. The electrical connector assembly as claimed in claim 12, wherein a metallic upper grounding bar is attached upon the upper insulator and comprises spring tangs mechanically and electrically connecting to metallic braiding layers of the wires.
14. The electrical connector assembly as claimed in claim 13, wherein the upper grounding bar further comprises a plurality of tabs separating the corresponding wires.
15. A plug connector comprising:
   a plug housing defining an oblique mating interface relative to an extending direction of the plug connector;
   a plurality of contacts retained in the housing and comprising retaining sections retained in the housing, contacting sections exposed upon the oblique mating interface, and soldering sections; and
   a plurality of wires extending rearwardly from the housing and electrically connected to soldering sections the corresponding contacts, respectively;

wherein the contacting sections of the contacts extend slantwise offset the extending direction of the plug connector from the retaining sections and provide lowest points for contacting with a receptacle connector in which the plug connector is inserted.

16. The plug connector as claimed in claim 15, wherein the plug housing comprises an insulative housing enclosing a contact module therein, the contact module comprises the contacts integrally formed within an insulator, the insulative housing defines a chamber, the insulator defines a chamber, the chambers of the insulative housing and the insulator commonly define the oblique mating interface.

17. The plug connector as claimed in claim 16, wherein the contact module defines two rows of the contacts formed within the insulator and each row of contacts connect with a row of wires, one row of the wires is located on an upper face of the insulator, the other row of the wires is located on an underside face of the insulator.

18. A receptacle connector comprising:
a receptacle housing mounted on a printed circuit board, the receptacle housing defining an oblique extending receiving space opening upwards and an elongated opening at a bottom wall thereof; and
a plurality of conductive pads defined on the printed circuit board and aligned with the elongated opening to expose to the receiving space.

19. The receptacle connector as claimed in claim 18, wherein the receptacle housing comprises the bottom wall, an upper oblique wall, a lower oblique wall, and two end wall integrally connecting with each other to commonly define the oblique extending receiving space, and the lower oblique wall defines a guiding recess at an upward face thereof.

20. The receptacle connector as claimed in claim 19, wherein the upper oblique wall defines a locking recess at a downward face thereof.

* * * * *